(12) United States Patent
Leidy et al.

(10) Patent No.: US 7,687,210 B2
(45) Date of Patent: Mar. 30, 2010

(54) SPACE TOLERANCE WITH STITCHING

(75) Inventors: Robert K. Leidy, Burlington, VT (US);
Paul D. Sonntag, Colchester, VT (US);
Peter J. Sullivan, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 11/767,633

(22) Filed: Jun. 25, 2007

(65) Prior Publication Data

US 2008/0315124 A1 Dec. 25, 2008

(51) Int. Cl.
*G03F 9/00* (2006.01)
*G03C 5/00* (2006.01)

(52) U.S. Cl. ................. 430/22; 430/5; 430/30; 430/296; 430/942

(58) Field of Classification Search ............ 430/5, 430/22, 30, 296, 942
See application file for complete search history.

(56) References Cited

U.S. PATENT DOCUMENTS

| | | | |
|---|---|---|---|
| 4,477,729 A | 10/1984 | Chang et al. | |
| 6,030,752 A | 2/2000 | Fulford, Jr. et al. | |
| 6,225,013 B1 | 5/2001 | Cohen et al. | |
| 6,381,077 B1 | 4/2002 | Jeong et al. | |
| 6,605,488 B1 | 8/2003 | Anderson | |
| 6,716,559 B2 * | 4/2004 | Leidy et al. | 430/22 |
| 7,129,024 B2 * | 10/2006 | Ki | 430/296 |
| 2005/0104089 A1 | 5/2005 | Engelmann et al. | |
| 2006/0040190 A1 | 2/2006 | Little et al. | |

FOREIGN PATENT DOCUMENTS

WO    WO 03/042759    5/2003

* cited by examiner

*Primary Examiner*—Christopher G Young
(74) *Attorney, Agent, or Firm*—Scully, Scott, Murphy & Presser, P.C.; Richard M. Kotulak, Esq.

(57) ABSTRACT

A method for manufacturing a stitched space in a semiconductor circuit implements a photolithographic process for printing one or more image fields on a wafer surface, each image field corresponding to a portion of a circuit or device and including a space that is to be stitched in adjacent image fields. The space to be stitched that is produced from an image field is overlapped onto the space to be stitched produced from the adjacent image field, however, the overlapped space from the adjacent image fields is intentionally misaligned. The stitched space is then subject to the double light exposure dose to print the stitched space, with the result that an overlay tolerance of the stitched space is improved.

16 Claims, 5 Drawing Sheets

| | 0.6 NA AVERAGE | 0.6 NA 3 SIGMA | 0.68 NA AVERAGE | 0.68 NA 3 SIGMA | FULL WAFER AVERAGE | FULL WAFER 3 SIGMA |
|---|---|---|---|---|---|---|
| 360 nm LINE TWO 180 nm LINES OVERLAPPED BY 144 nm DELTA | 355 | 9.0 | 350 | 12.6 | 354 | 7.6 |
| | 190 | 14.2 | 175 | 12.1 | 189 | 13.7 |
| | 165 | | 175 | | 166 | |
| 360 nm SPACE TWO 180 nm SPACES OVERLAPPED BY 144 nm DELTA | 371 | 10.7 | 376 | 13.5 | 370 | 11.7 |
| | 273 | 7.0 | 271 | 9 | 273 | 7.3 |
| | 98 | | 105 | | 97 | |

SPACE TOLERANCE WITH STITCHING

FIELD OF THE INVENTION

The present invention relates to semiconductor photolithographic processes and techniques for forming integrated circuit chips, and particularly, to a novel, non-intuitive lithographic-based technique for stitching two spaces together spaces that have a tighter tolerance than a standard space stitching technique.

DESCRIPTION OF THE PRIOR ART

In semiconductor lithographic processes, circuits, which may comprise electronic devices including active and passive elements interconnected by one or more conductors (lines), are typically formed by successively imprinting patterns onto a semiconductor wafer utilizing one or more photolithographic masks, and performing series of etches and depositions of materials that form on and/or react with the wafer. Typically, circuits or devices are defined on a photoresist layer that is subject to one or image fields by exposing the photoresist to illumination through a reticle. The reticle or image fields may be formed on a plurality of lithographic masks and image fields may be "stitched" together during a stepper process to produce a complete image field when the device or circuit boundary exceeds an image field size of the stepper apparatus. In conventional techniques, the stepper apparatus aligns itself to registration marks, e.g. that may have been previously placed on the wafer to accurately indicated the orientation of the image fields produced with the stepper.

Subsequent to the placement of the registration marks by photolithography, the wafer is subject to placement or orientation by the stepper apparatus to enable the photolithographic process to utilize the registration marks to orient the wafer relative to the print image. For each layer to be printed, any adjacent images must be aligned with extremely high precision such that there is optical continuity along a line or a space or a patterned device region. The method utilized is called image field stitching.

In these semiconductor lithographic processes, it is well known that isolated lines print with tighter tolerances than isolated spaces. This is illustrated in the description and analysis of FIGS. 1A, 1B and 2A, 2B to be described. FIGS. 1A, 1B particularly show how an example metal line feature pattern (reticle design) 10 (FIG. 1A), at each of successively smaller feature sizes, is stitched and printed at those feature sizes (FIG. 1B). In FIG. 1A, each metal line feature pattern 10 comprises lines 11 and spaces 12 therebetween. A line from the pattern 10 is to be stitched when at a butted (no or zero overlap) position at a stitch boundary indicated at the arrow 15 depicted in the figure. FIG. 1B shows optical images of the resulting printed stitched design pattern 10 including the resulting stitched metal line 19 on the wafer surface 25 at each of the successively smaller feature sizes 25a, 25b, 25c and 25d. As shown in FIG. 1B, there is noted the smooth seamless appearance at the stitched boundary of stitched line 19 at each of various feature sizes, i.e., the metal lines stitch with no error, or at least error that is imperceptible at the optical resolutions of the imaging device for the feature sizes 25a, 25b, 25c and 25d shown in FIG. 1B. However, for spaces, as shown in FIGS. 2A, 2B, this is not the case. That is, given the metal space feature pattern 10' (FIG. 2A), at each of successively smaller feature sizes in this illustrative example, a space 12 from the pattern is to be stitched (with no or zero overlap) at a stitch boundary indicated at the arrow 30 depicted in the figure. FIG. 2B shows the resulting optical image of the stitched metal space 29 on the wafer surface 25'. It is clear from FIG. 2B the appearance of errors at the stitched boundary as they print at each of various feature sizes 35a, 35b, 35c and 35d and particularly the smaller feature sizes 35c, 35d as shown in FIG. 2B. That is, the spaces between the metal lines stitch with error, e.g., jogs and other type errors that are perceptible at the optical resolutions of the imaging device, for feature sizes at 0.32 um (when two 160 nm spaces are butted) and smaller because of space resolution issues.

This is driven by interference from the light from each edge of the isolated line that is not possible with an isolated space that is essentially single slit diffraction. Isolated spaces are desirable as they define the emitter in a bipolar device (e.g., SiGe or otherwise) for example, and while the emitter might not be a minimum space, it needs to be controlled very tightly from an image size and overlay standpoint to reduce the parasitics associated with the extrinsic base.

Prior art references U.S. Pat. No. 6,225,013 and WO/2003/042759 are representative of stepped photolithographic processes using a plurality of mask region image fields that are to be "stitched" to define a device, e.g., by aligning the stitched image fields in manner such that they overlap during the stepper process. However, each of these patents address stitching of line features, and not spaces, and are directed to profiling of the image areas so as to minimize optical losses.

It would thus be highly desirable to provide a semiconductor lithographic "stitching" process that exhibits tighter tolerance for stitched spaces as opposed to a standard stitching process for spaces.

It would thus be highly desirable to provide a semiconductor lithographic stitching process that exhibits tighter tolerance for stitched spaces that are parallel to the stitched boundary and result in a seamless stitch.

It would therefore be desirable to provide a semiconductor lithographic stitching process that exhibits tighter tolerance for stitched spaces at 0.18 µm technology and smaller feature sizes.

SUMMARY OF THE INVENTION

The invention relates generally to an improved, non-intuitive lithographic-based technique for stitching two spaces together spaces that have a tighter tolerance than a standard space stitching technique.

Thus, according to one aspect of the invention, there is provided a method for generating a stitched spaces defined by adjacent image patterns in a photolithographic system.

According to one aspect of the invention, there is provided a method for stitching segments designed by adjacent image patterns of a photolithographic system during the manufacture of a semiconductor circuit or device.

The method exploits a novel, non-intuitive recognition that a stitched space has a tighter tolerance than a standard space when two spaces are stitched together with a double exposure. Even with the added tolerance associated with stitching, the final space width tolerance is shown to be improved to the level of the unstitched line. Stitching can be done with one mask exposed twice with a small off-set in x- and y-directions. This gives a tighter tolerance in the space than standard lithography according to conventional solutions.

Thus, there is provided a method for manufacturing a stitched space in a semiconductor circuit having improved overlay tolerance, where the stitching is carried out with a double light exposure dose of a single mask with intentional offset of the mask from the space to be stitched, wherein a tighter tolerance control for a stitched space is achieved as compared to an unstitched space.

The method for manufacturing a stitched space in a semiconductor circuit implements a photolithographic process for printing one or more image fields on a wafer surface, each image field corresponding to a portion of a circuit or device and including a space that is to be stitched in adjacent image fields. According to the invention, the space to be stitched that is produced from an image field is overlapped onto the space to be stitched produced from the adjacent image field, however, the overlapped space from the adjacent image fields is misaligned according to the intentional offset. The stitched space is then subject to the double light exposure dose to print the stitched space, with the result that an overlay tolerance of the stitched space is improved.

Advantageously, the methods employed by the present invention can be utilized for printing space width features of at least 180 nm technology with a greater degree of control.

BRIEF DESCRIPTION OF THE DRAWINGS

The objects, features and advantages of the present invention will become apparent to one skilled in the art, in view of the following detailed description taken in combination with the attached drawings, in which.

DETAILED DESCRIPTION OF PREFERRED EMBODIMENTS

In a methodology for printing semiconductor device and circuit images comprising lines (i.e., conductors) and spaces in between the lines, the present invention exploits a novel and non-intuitive recognition that a stitched space has a tighter tolerance than a standard space by stitching two spaces together with a double exposure. Even with the added overlay tolerance associated with stitching, the final space width tolerance is improved to the level of the unstitched line. Stitching can be performed with one mask exposed twice with a small off-set in x and y axes. This gives a tighter tolerance in the space than standard lithography, which would be the conventional solution.

Figure 1A:
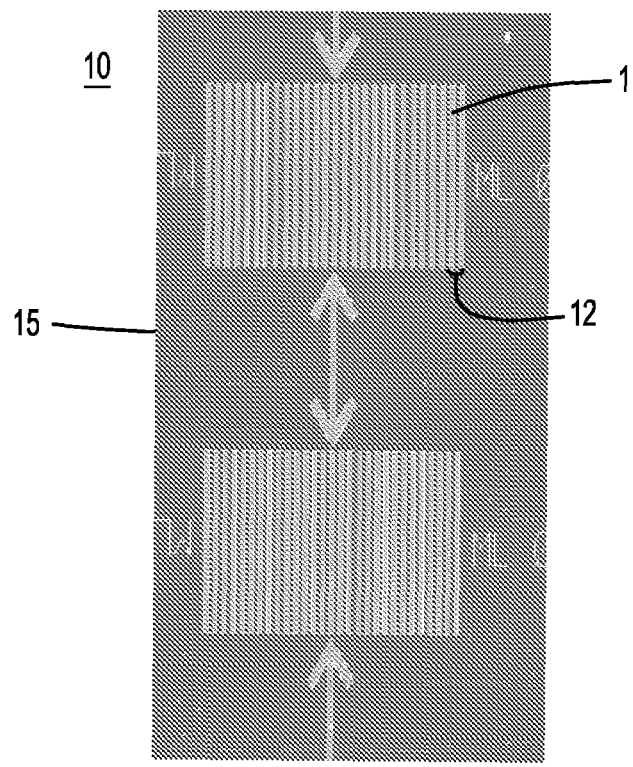
FIGS. 1A, 1B particularly show how an example metal line feature pattern (reticle design) 10 (FIG. 1A), at each of successively smaller feature sizes, is stitched at a metal line stitch boundary and printed on a wafer at those feature sizes (FIG. 1B) according to conventional methods.
Figure 1B:
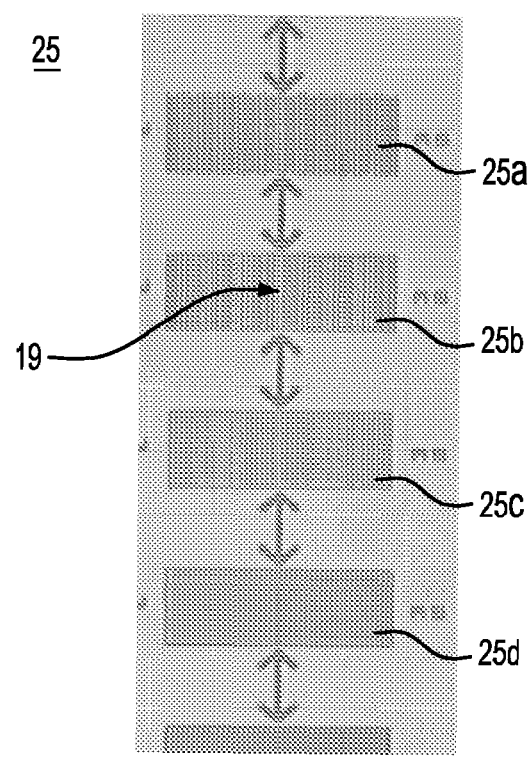
Figure 2A:
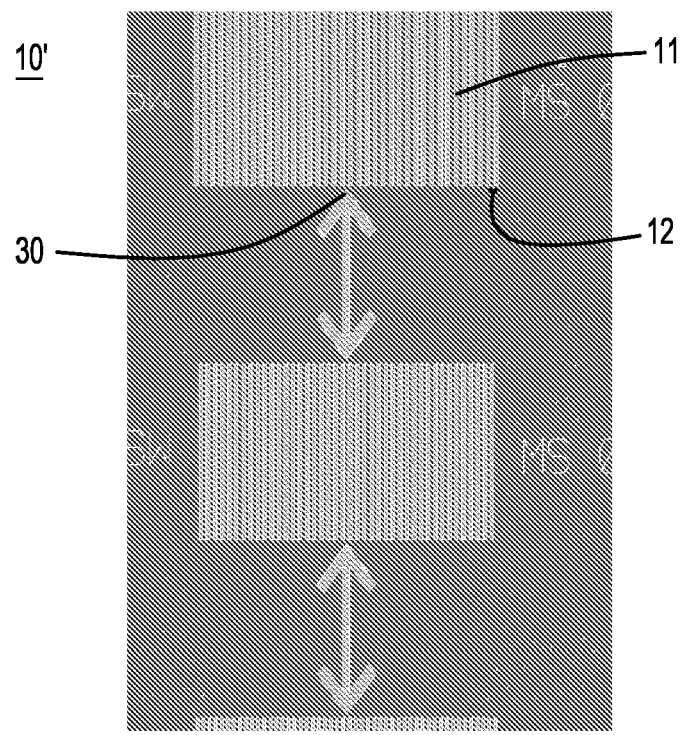
FIGS. 2A, 2B particularly show how an example metal space feature pattern (reticle design) 10 (FIG. 2A), at each of successively smaller feature sizes, is stitched at a space stitch boundary and printed on a wafer at those feature sizes (FIG. 2B) according to conventional methods.
Figure 2B:
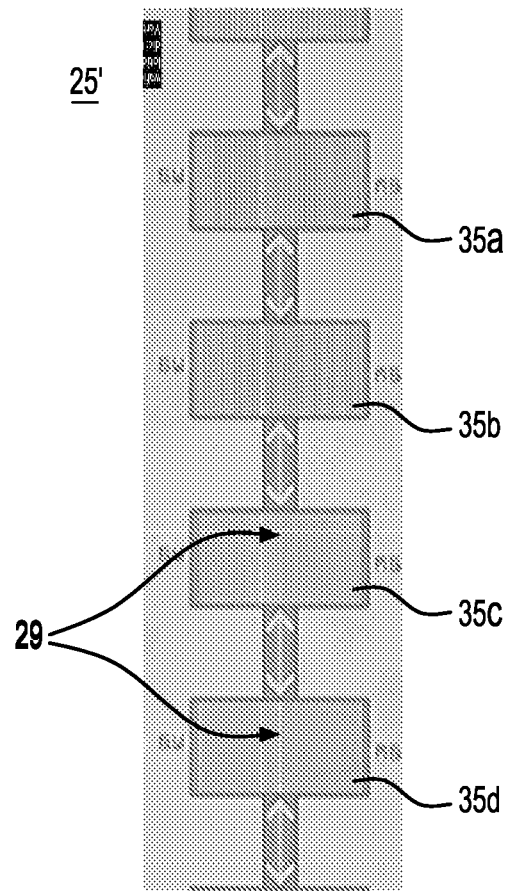
Figure 3A:
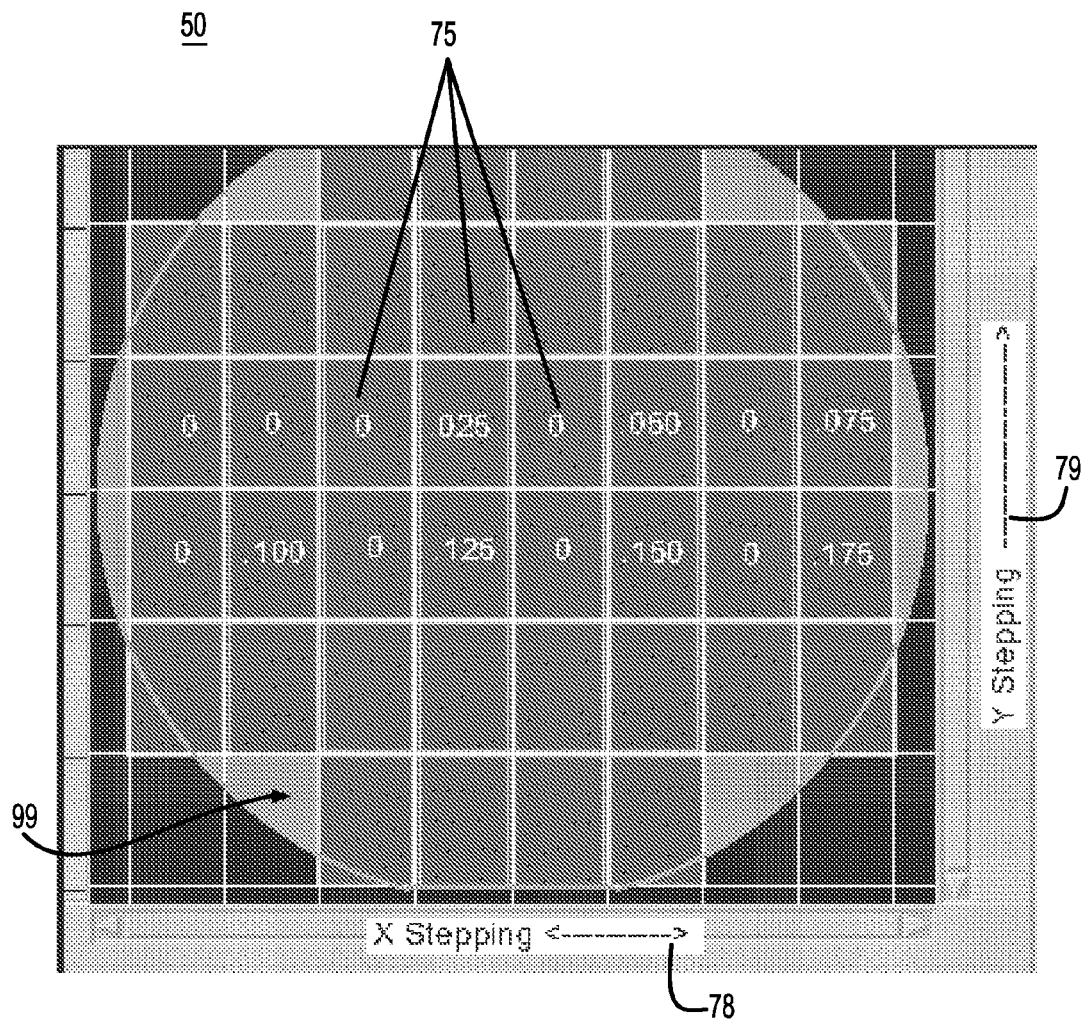
FIG. 3A depicts an example test pattern image layout on the wafer as found during a precursor step of determining overlay tolerance for the photolithographic tooling used in accordance with the present invention.
Figure 3B:
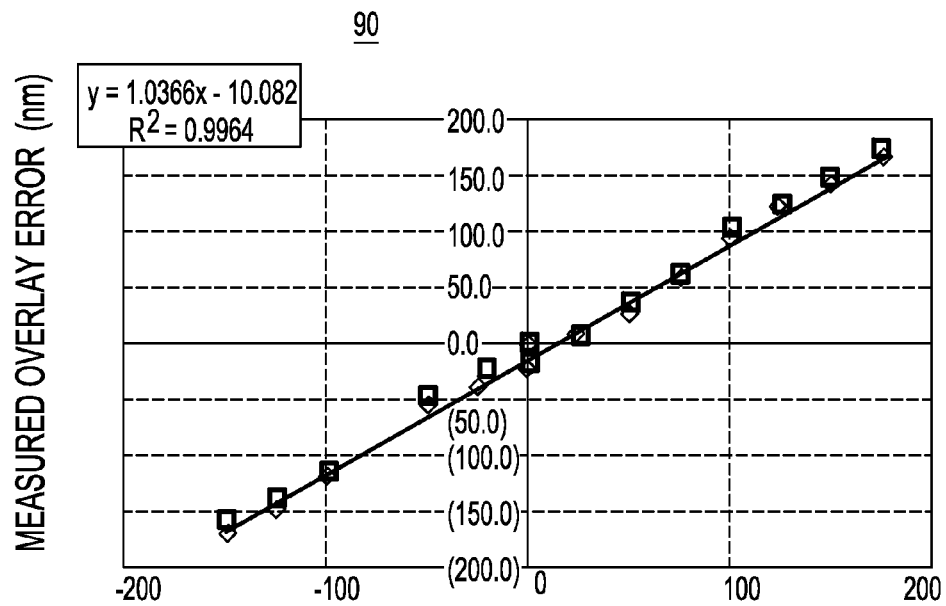
FIG. 3B depicts a graph 90 of the overlay error induced by the intentional stepping errors provided as a result of the example stepper process performed as described with respect to FIG. 3A.

FIG. 3A illustrates a resulting printed layout 50 of example test pattern images 75 that have been "stitched" together on the surface of a test wafer 99. To generate the layout 50 of FIG. 3, a test photolithographic mask (not shown) has been imaged on the wafer using a photolithographic stepper process to produce image fields 75. In the process, the mask is stepped with intentional errors to generate respective image fields that are stitched together at a stitch boundary with various x-direction offsets 78 and y-direction offsets 79. In this manner, the mask overlay tolerance is determinable. That is, by intentionally generating overlay errors, e.g., by a stepping the mask with intentional errors in either X-step direction, Y-step direction, or both, as indicated in the FIG. 3A, overlay error may be determined. FIG. 3B depicts a graph 90 of the overlay error induced by the intentional stepping errors provided as a result of the example stepper process performed as described with respect to FIG. 3A. The overlay error is plotted as a graph 90 of the measured overlay error in nanometers (y-axis) versus the intended overlay errors (corresponding to the programmed intentional stepping errors) of the photolithographic stepping process. This graph 90 allows for the evaluation of stitching optimization—centering the frame overlap—and process window evaluation for any level.

Then, accounting for any calculated overlay errors from the photolithographic stepper apparatus, a photolithographic stitching process was performed whereby a test mask having a metal line pattern resulting in a formed field image pattern on the wafer, is stepped adjacent to the image to form a second field image pattern to be stitched to the first pattern. In this model, the linewidth of the stitched line is measured over a range of frame overlap and underlap conditions.

Figure 4:
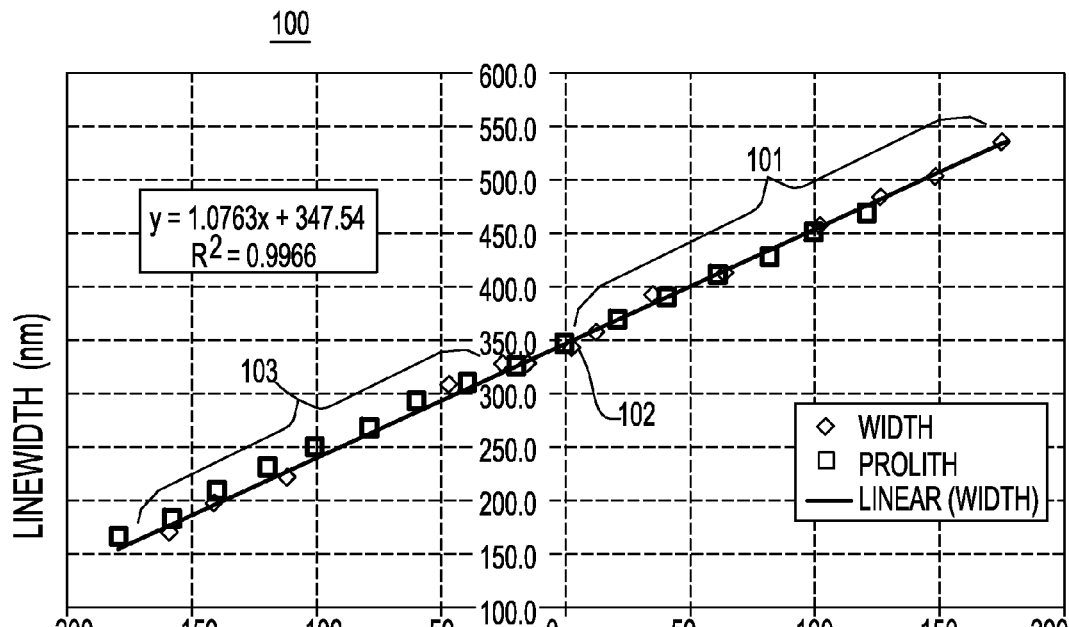
FIG. 4 depicts the well-behaved (linear) response 100 when line images form as overlay is varied.

That is, for example, two line feature images at 0.18 μm widths (180 nm nominally butted lines) that are to be stitched are first separated with a gap (underlapped) and then brought together (overlapped) during a stepping process. The resulting linewidth measurements (in nanometers) on the wafer is plotted as a function of the stitched overlap condition (in nanometers) as shown in FIG. 4. FIG. 4 particularly depicts the well-behaved (linear) response 100 of how line images form as overlay is varied. That is, the frame holding the test pattern mask is stepped so that the 180 nm wide lines to be stitched are printed on the wafer and resulting linewidth measured at first underlapped conditions 101, then at an abutting condition at 102 with no gap separating the lines, and finally at overlapped conditions 103 over a large range. It is understood that there effectively is an extra UV light dose applied to the exposed line feature image when overlapped.

Figures 5, 6:
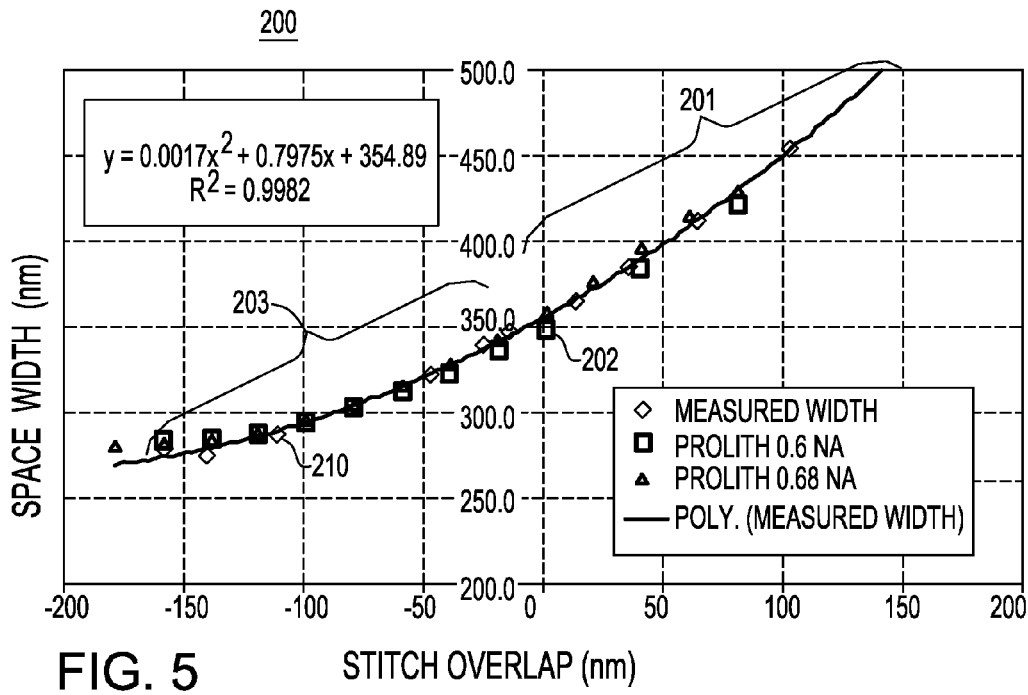
FIG. 5 particularly depicts the quadratic response 200 of how space feature images form as overlay is varied; and, FIG. 6 depicts example summary data 300 of the example linewidth and space width measurement results for both stitched and unstitched lines.

Spaces in the pattern image provide a different result. Two spaces that are printed when in a separated (underlapped) condition each get a normal UV light exposure dose. However, when the printed line space features are overlapped in the manner as described with respect to FIG. 4, they effectively get a double dose. However, the measured linewidths show a quadratic (i.e., non-linear) response 200 as shown in FIG. 5. FIG. 5 particularly depicts the quadratic response 200 of how space feature images form as overlay is varied. That is, the frame holding the test pattern mask is stepped so that the 180 nm wide space feature to be stitched are printed on the wafer and resulting space width is measured at underlapped conditions 201, then at an abutting condition at 202 with no gap separating the spaces, and finally at overlapped conditions 203 over a large range. It is understood that there effectively is an extra UV light dose applied to the exposed space feature image when overlapped resulting in a flattening out of the stitched space width response at the overlapped condition. Thus, in the example provided in FIG. 5, due to the quadratic response curve for overlapping spaces, in the example described with respect to FIG. 4, two 180 nm wide space features resolved to approximately 0.27 μm wide stitched space when subject to a 120 μm overlap as indicated at 210 in FIG. 5.

In a final experimental test run, a whole wafer was run to stitch two lines and space features of 180 nm width subject to a 144 nm fixed overlap condition, in the example test run. The resulting printed line widths and space widths were measured under stitched and unstitched condition. A summary 300 of the respective linewidth and space width measurement results are found in FIG. 6. As shown in FIG. 6, the line measurement was made under a no overlap (i.e., abutting) condition at 301; and then the line measurement was made of the stitched line under the fixed exemplary 144 nm overlap condition at 305. As shown in FIG. 6, it is clear that the standard deviation (3 Sigma value) increases from 9.0 to 14.2 indicating that the stitched (printed) linewidth response worsens due largely to the overlay error. This result thus indicates that there is reduced linewidth control when stitching lines. However, with the same experiment set up for spaces, i.e., the two space width measurements, e.g., a 180 nm space, the measurement was made under a non-overlap (i.e., abutting) condition at 311, and then the space measurement was made of the stitched space under the fixed 144 nm overlap condition at 315. As shown in FIG. 6, it is clear that the standard deviation (3 Sigma value) in this case decreases from 10.7 to 7.0 indicating that the stitched (printed) space width response improves despite the presence of overlay errors. Thus, printed stitched spaces have a tighter tolerance than spaces that are printed without the overlapping technique (i.e., unstitched).

Aerial images of spaces are generally worse than aerial image patterns for lines, in general. However, due to the shape of the space response curve shown in FIG. 5, for spaces, an overlay tolerance will not change the space width when spaces are printed in overlapped condition. It is additionally seen from the results shown in FIG. 6 that the tolerance for a stitched space is comparable, if not better than, the tolerance of an unstitched line for the current technology (e.g., 0.18 μm).

Thus, according to the invention, a line feature may be stitched with good degree of accuracy given the characteristic linear response curve 100 plotted in FIG. 4. Likewise, a space feature having a space width may be stitched with good spacewidth results (i.e., tighter tolerance) when there is overlap (and slight misalignment) of the printed space feature images at a given overlay tolerance as the overlap requires a double light exposure dose. That is, using the characteristic quadratic response curve 200 plotted in FIG. 5, stitched spaces may be formed with a good degree of accuracy because the stitched space has tighter tolerance control than a non-stitched space.

While the embodiments of the invention as described herein assumed the use of positive photoresist, it is the case that using negative resist for this application will render the mask as resembling the positive line feature. Thus, although the aerial image is improved, the negative resists are not as good as the positive resist, so this may be a less effective solution than the applications use with a positive resist.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for manufacturing a semiconductor circuit having line and space features of specific width, comprising:
   implementing a photolithographic process for printing one or more image fields on a wafer surface, each image field corresponding to a portion of a circuit or device and including a space that is to be stitched in adjacent image fields;
   overlapping the space to be stitched produced from an image field onto the space to be stitched produced from an adjacent image field, the overlapped space from said adjacent image fields being intentionally misaligned;
   subjecting said stitched space to a double light exposure dose to print said stitched space, whereby a tolerance of said stitched space is improved.

2. The method as claimed in claim 1, wherein said photolithographic process for printing one or more image fields on a wafer surface is a stepper process.

3. The method as claimed in claim 1, wherein said photolithographic process includes defining an image field on a photolithographic mask.

4. The method as claimed in claim 1, wherein said photolithographic process for printing image fields is subject to an overlay tolerance.

5. The method as claimed in claim 1, wherein said intentional misalignment is an offset in an X-axis direction.

6. The method as claimed in claim 1, wherein said intentional misalignment is an offset in a Y-axis direction.

7. The method as claimed in claim 1, wherein said intentional misalignment is an offset in both X-axis direction and Y-axis directions.

8. The method as claimed in claim 1, wherein a stitched space response is quadratic over a large range.

9. The method as claimed in claim 1, wherein a space width feature is about 0.18 μm.

10. A photolithographic method comprising:
    aligning a reticle for forming an image field on a semiconductor wafer, said reticle patterned for producing line and space features of a semiconductor circuit upon a surface of said wafer;
    exposing said reticle to a first light dose for forming a first image field having said line and space features;
    aligning said reticle for forming a second image field on a semiconductor wafer to be stitched to said first image field, wherein a space feature to be stitched in said second image field is intentionally misaligned in overlapped relation with a corresponding space feature from said first image field to be stitched;
    exposing said reticle to a second light dose for forming said second image field having said line and space features with said space feature to be stitched,
    wherein said stitching of said space feature is carried out with a double light exposure dose of a single reticle to achieve tighter tolerance control as compared to an unstitched space.

11. The method as claimed in claim 10, wherein said aligning of said reticle for printing said first and second image fields on a wafer surface includes a stepper process.

12. The method as claimed in claim 10, wherein said printing said first and second image fields is subject to an overlay tolerance.

13. The method as claimed in claim 10, wherein said intentional misalignment is an offset in an X-axis direction.

14. The method as claimed in claim 10, wherein said intentional misalignment is an offset in a Y-axis direction.

15. The method as claimed in claim 10, wherein said intentional misalignment is an offset in both X-axis direction and Y-axis directions.

16. The method as claimed in claim 10 wherein a stitched space response is quadratic over a large range.

* * * * *